(12) United States Patent
Zweers

(10) Patent No.: US 6,435,394 B1
(45) Date of Patent: Aug. 20, 2002

(54) TRANSPORTER FOR LEAD FRAMES AND TRANSPORT ASSEMBLY

(75) Inventor: Johannes Gerhardus Augustinus Zweers, Wehl (NL)

(73) Assignee: Fico B.V. (NL)

( * ) Notice: Subject to any disclaimer, the term of this patent is extended or adjusted under 35 U.S.C. 154(b) by 0 days.

(21) Appl. No.: 09/462,683
(22) PCT Filed: Jul. 9, 1998
(86) PCT No.: PCT/NL98/00396
§ 371 (c)(1),
(2), (4) Date: Jan. 11, 2000
(87) PCT Pub. No.: WO99/03317
PCT Pub. Date: Jan. 21, 1999

(30) Foreign Application Priority Data

Jul. 11, 1997 (NL) .............................................. 1006561

(51) Int. Cl.[7] .............................................. B65H 20/00
(52) U.S. Cl. .................... 226/176; 226/187; 226/190
(58) Field of Search ................. 226/187, 185, 226/176, 174, 190, 177, 108

(56) References Cited

U.S. PATENT DOCUMENTS

| | | | | |
|---|---|---|---|---|
| 1,946,170 A | * | 2/1934 | Mikaelson | .................. 226/176 |
| 2,320,659 A | * | 6/1943 | Sahlin | .................... 226/176 X |
| 3,227,345 A | * | 1/1966 | Eckhardt | .................... 226/176 |
| 3,292,444 A | * | 12/1966 | Bentley | .................. 226/187 X |
| 3,674,194 A | * | 7/1972 | Moesser | .................... 226/187 |
| 4,119,256 A | * | 10/1978 | Vogtmann et al. | .......... 226/177 |
| 4,674,670 A | * | 6/1987 | Watanabe et al. | ........... 228/102 |
| 4,700,877 A | | 10/1987 | Dodds et al. | |
| 4,759,485 A | * | 7/1988 | Braun et al. | ................. 226/176 |
| 5,074,139 A | | 12/1991 | Elliott | |
| 5,507,226 A | * | 4/1996 | Burke et al. | ............ 226/190 X |
| 5,868,296 A | * | 2/1999 | Gentile et al. | |
| 5,967,512 A | * | 10/1999 | Irsik | ....................... 226/177 X |

OTHER PUBLICATIONS

Patent Abstracts of Japan, vol. 8, No. 194 (E–264), Sep. 6, 1984 and and JP 59 080956 A, Fuji Plant Kogyo KK, May 10, 1984.

Patent Abstracts of Japan, vol. 95, No. 11, Dec. 26, 1995 and JP 07 211735 A, Hitachi Ltd., Aug. 11, 1995.

* cited by examiner

Primary Examiner—Michael R. Mansen
(74) Attorney, Agent, or Firm—Webb Ziesenheim Logsdon Orkin & Hanson, P.C.

(57) ABSTRACT

A transporter for lead frames has two rotatable wheels with mutually facing running surfaces for engaging a lead frame between the wheels. A frame supports the wheels. An actuating cylinder engages on at least one wheel for mutual displacement of the wheels. An assembly of two such transporters is also disclosed.

8 Claims, 2 Drawing Sheets

TRANSPORTER FOR LEAD FRAMES AND TRANSPORT ASSEMBLY

BACKGROUND OF THE INVENTION

1. Field of the invention

The invention relates to a transporter for lead frames, comprising:

two rotatable wheels with mutually facing running surfaces for engaging a lead frame between the wheels, and a frame supporting the wheels.

The invention also relates to an assembly of two such transporters.

2. Description of the Prior Art

The transporters of the type stated in the preamble used according to the prior art for displacing and positioning lead frames are generally very suitable for transporting a particular type of lead frame which can be transported with wheels. The application possibilities of the existing transporters are however limited to this type of lead frame.

The present invention has for its object to provide an improved type of transporter as described above with which lead frames of varying dimensions, in particular width and thickness, can be transported without complex changeovers. In addition, a flexibility is sought such that a lead frame can be removed manually from a transporter in relatively simple manner, for instance in the case of defects.

SUMMARY OF THE INVENTION

The present invention provides for this purpose a transporter of the type stated in the preamble, comprising:

an actuating cylinder engaging on at least one wheel for mutual displacement of the wheels.

The actuating cylinder is preferably adapted to exert a biasing force. Lead frames of varying thickness can hereby be displaced and/or positioned by the transporter. Another advantage of the actuating cylinder is that it can be employed to exert the biasing force, this biasing force likewise being variable. Depending on the type of lead frame for transporting, the biasing force exerted on the lead frames can thus be varied in simple manner. It is also possible to move the wheels so far apart with the actuating cylinder that a lead frame can be easily removed or inserted. By coupling the actuating cylinder of a transporter to an intelligent control it is also possible to control the clamping force of wheels and/or moving apart of the wheels by means of chosen variables. The actuating cylinder also renders a mechanical spring element unnecessary. This decreases the susceptibility of the device to wear. The actuating cylinder can also be employed as dynamic spring element, which increases the flexibility of the transporter.

At least one wheel is preferably provided with coupling means for a drive to cause rotation of the wheel. Such coupling means enable simple connection of the unit to an external drive, for instance a drive for a plurality of transporters simultaneously. A less flexible and usually more costly alternative herefor is to provide each transporter with a separate drive. An additional drawback thereof is the problem of synchronization of a plurality of transporters.

In a preferred embodiment the actuating cylinder is integrated into the frame. With this measure the transporter can take a relatively compact form, which is particularly advantageous in the complex devices for processing lead frames. Due to integration of the cylinder the transporter also comprises relatively few protruding parts, which makes the transporter less vulnerable. Such a transporter is moreover found to be relatively inexpensive in production.

In another preferred embodiment at least one of the wheels is connected to a translatable guide rod, and a recess receiving the guide rod is arranged in the frame. The guide rod is herein preferably so long that, at least when wheels are placed practically against each other, it projects relative to the frame. By exerting a force on the guide rod the wheels can thus be moved apart. It is thus possible for instance in a press construction, to cause the wheels to move apart during an incoming ram movement. This is particularly desirable since the function of the transporter is required particularly between two successive operations. It is precisely during performing of a determined process that it is usually undesirable for the transporter to engage a lead frame. Due to the guide rod construction the closing of a press, i.e generally the moment at which the process is carried out, can be mechanically coupled to the moving apart of the wheels of a transporter. Another advantage is that such guide rods can also be manually depressed in simple manner, whereby it becomes possible to move apart the wheels of the transporter manually.

In yet another preferred embodiment, the running surface of at least one of the wheels is provided with a substantially cylinder jacket-like running surface for engaging on a lead frame and a standing edge connects onto this running surface on one side, whereby the minimum mutual distance between the running surfaces of the wheels is bounded. The standing edge of a first wheel will in any case lie against the running surface of the second wheel when the wheels are urged against each other, whereby the running surface of the wheel with standing edge is left clear. The advantage of this construction is that a lead frame can be engaged relatively simply between two wheels when the wheels are urged against each other in simple manner.

The invention also comprises an assembly of two transporters as described above, wherein at least one of the wheels of a first transporter is in at least coupled for fixed rotation to one of the wheels of a second transporter. In a preferred embodiment this fixed rotation coupling is realized in that the coupled wheel of the first transporter is provided with at least one projecting coupling shaft and the coupled wheel of a second transporter is provided with a recess for receiving this coupling shaft. A rigid coupling of two mutually opposite transporters has the advantage that a lead frame will be fed through uniformly between both transporters and there is no danger of a change in orientation of the lead frame during transport.

In a preferred embodiment of the assembly, at least one of the transporters is provided with mounting means for releasable mounting of the transporter on a support element such that the transporter is translatable in the direction parallel to the rotation axis of the wheel. The width of the lead frame for transporting can be adjusted by adjusting the mutual distance between the transporters of the assembly. Lead frames of varying width can thus be transported. It is usually desirable herein that a translation of a first transporter corresponds with a translation in opposing direction of the other transporter, for which purpose are known prior art constructions which can be used. It is thus possible to realize that the transporting axis of lead frames of varying width remains constant.

BRIEF DESCRIPTION OF THE DRAWINGS

The present invention will be further elucidated with reference to the non-limitative embodiments shown in the following figures. Herein.

DETAILED DESCRIPTION OF THE PREFERRED EMBODIMENTS

Figure 1:
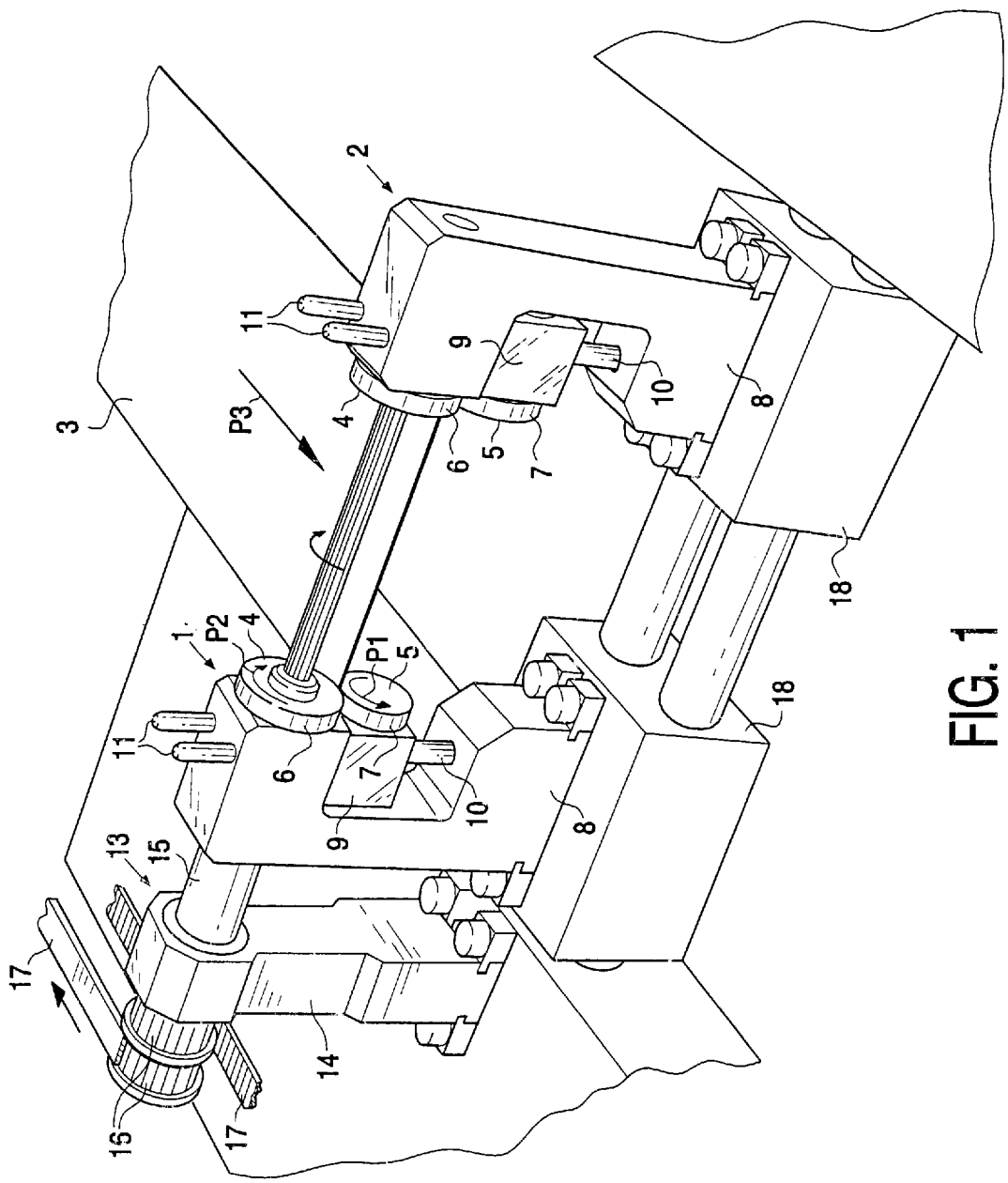
FIG. 1 is a perspective view of an assembly of transporters according to the invention.

FIG. 1 shows a perspective view of an assembly of transporters 1,2 for transporting lead frame 3. Both transporters 1,2 are provided with two wheels 4,5, the respective running surfaces 6,7 of which face toward each other. Between running surfaces 6,7 of wheels 4,5 is engaged a lead frame 3 which is transported in a transporting direction P3 by rotation of the wheels as according to arrows P1, P2.

The upper wheel is rotatably connected at a stationary position to a substantially C-shaped frame 8. The lower wheel 5 is rotatably connected to a support block 9. This latter is connected via a piston rod 10 to an actuating cylinder arranged in the bottom of frame 8 and not visible in this figure. The top part of support block 9 is rigidly connected to two guide rods 11 which protrude above the top of frame 8. Arranged for this purpose in frame 8 are recesses 31,32 into which guide rods 11 are inserted.

For synchronized drive of the two transporters 1,2 these latter are mutually connected by means of a coupling rod 12 such that rotation of upper wheel 4 of transporter 1 is rigidly coupled to rotation of upper wheel 4 of transporter 2.

The drive of transporters 1,2 takes place via a coupling unit 13. This latter consists of an upright 14 in which is received a rotatably mounted shaft 15. A one outer end of shaft 15 is provided with toothed wheels 16 on which engage toothed belts 17. With this construction a plurality of assemblies of transporters 1,2 can be connected fixedly to each other and to a central drive.

The connection between rotatable shaft 15 and upper wheel 4 of transporter 1 is such that transporter 1 can be shifted in axial direction relative to shaft 15 without this resulting in immediate breaking of the connection between rotatable shaft 15 and upper wheel 4. The position of transporter 1 is thus adjustable relative to coupling unit 13. For an adjustment of the transporting width of the assembly of transporters 1,2 such that the centre line of a lead frame 3 for transporting is always located at the same position, the transporters 1,2 are fixed onto carrying blocks 18. A displacement of one of the carrying blocks 18 results in a displacement in opposing direction of the other arrying block 18. This construction serves only by way of example. It is equally possible to place transporters 1,2 in slots or connect them in other manner to a support frame. The second transporter 2 is provided with a continuous recess 19 which connects onto a central opening in the upper wheel 4 of transporter 2. During axial displacement of transporter 1 and/or 2 the coupling rod 12, which is rigidly connected to transporter 1, will be able to displace in axial direction relative to upper wheel 4 of transporter 2. It will be apparent that the coupling shaft 12 and the central recess in upper wheel 4 of transporter 2 must have a cross-sectional form varying from a circular shape, this on account of the rotation rod coupling of upper wheels 4 of transporters 1,2.

Figure 2:
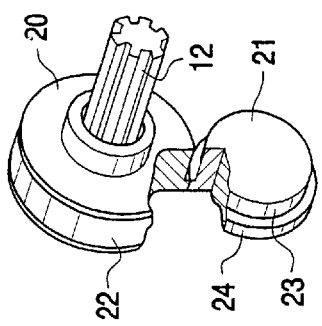
FIG. 2 is a perspective view of two wheels according to the invention.

FIG. 2 shows a detail view of two wheels 20,21, of which the upper wheel 20 is connected to coupling rod 12. The running surface 22 of upper wheel 20 has a cylinder jacket-like form, in contrast to that of lower wheel 21. While lower wheel 21 does also have a cylinder jacket-like contact surface 23 for engaging on a lead frame, a protruding edge 24 adjoins this contact surface 23. This protruding edge 24 bounds the minimum distance between running surface 22 of upper wheel 20 and contact surface 23 of lower wheel 21.

A lead frame 3 can be introduced relatively simply between wheels 20,21, at least when lower wheel 21 engages lead frame 3 only by means of contact surface 23.

Figure 3:
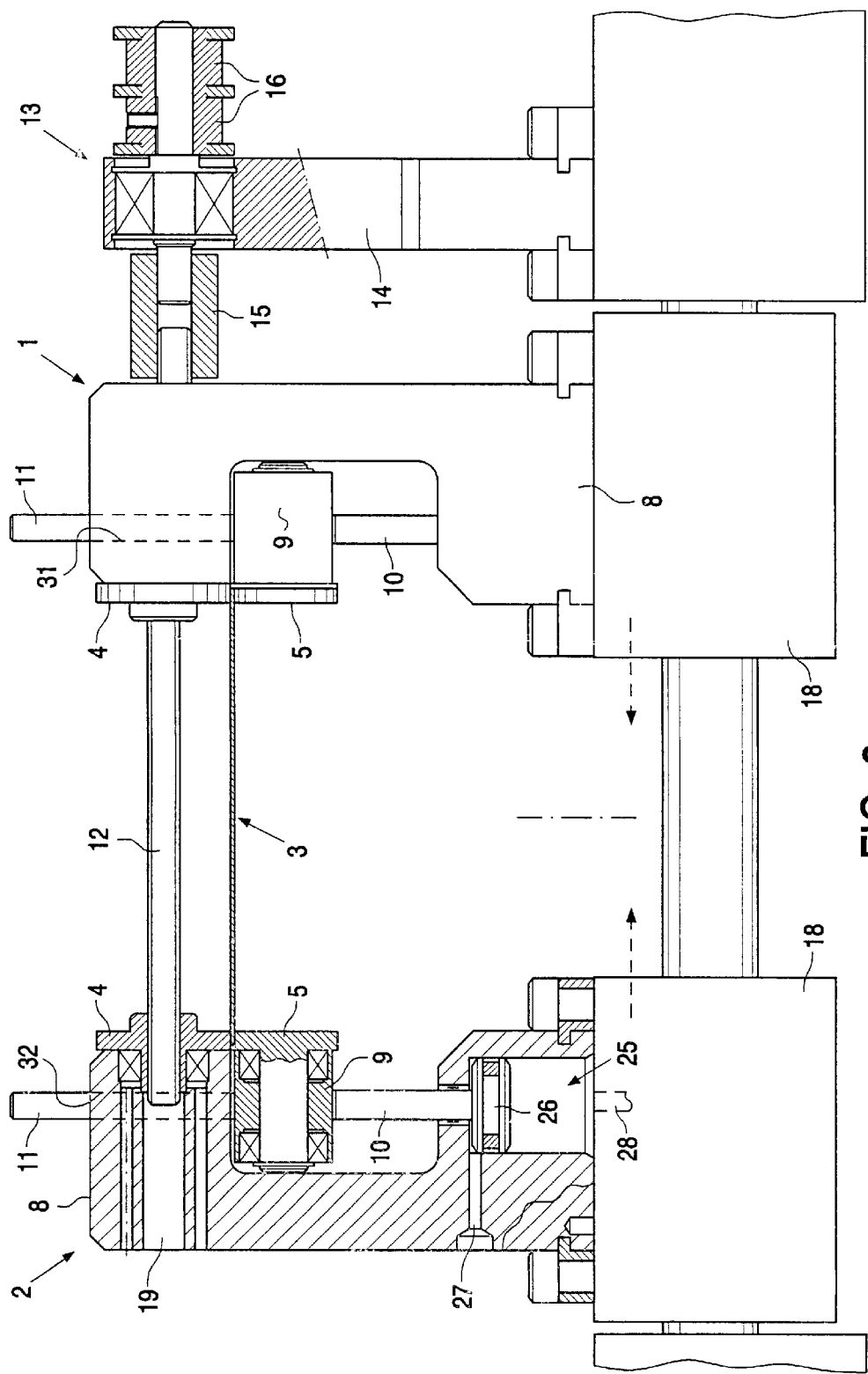
FIG. 3 is an elevational view in partial cross-section of the assembly of the transporters of FIG. 1.

FIG. 3 shows a cross-section through the assembly of transporters 1,2 and coupling unit 13 shown in FIG. 1.

Clearly visible in the cut-away transporter 2 is the cylinder construction arranged in the bottom of frame 8. A piston 26 is connected to piston rod 10 for vertical displacement of support block 9. Piston 26 can be displaced by means of a medium through feed and discharge conduits 27,28. Support block 9 is thus displaceable in vertical direction. Bearings are accommodated in support block 9 for rotatable support of lower wheel 5. In addition to a vertical displacement of support block 9, it is also possible using the cylinder construction 25 to exert an upward directed bias on support block 9. Wheels 4,5 can thus engage with an adjustable bias on a lead frame 3.

This figure also shows that the upper wheel of transporter 2 is provided with a central aperture for passage of the coupling rod 12. The central aperture in upper wheel 4 connects onto recess 19 in frame 8.

I claim:

1. A transporter for lead frames, comprising:
   two rotatable wheels with mutually facing running surfaces for engaging a lead frame between the wheels,
   a frame supporting the wheels, and
   an actuating cylinder integrated into the frame and engaging on at least one wheel for relative displacement of the wheels,
      wherein the running surface of at least one of the wheels is provided with a substantially cylindrical jacket-like running surface for engaging on the lead frame, and a standing wall connects onto this running surface on one side and is outside the perimeter of this running surface, whereby the minimum mutual distance of the running surfaces of the wheels is bounded.

2. The transporter as claimed in claim 1, wherein the actuating cylinder is adapted to exert a biasing force.

3. The transporter as claimed in claim 1, wherein at least one of the wheels is provided with coupling means to receive a drive to cause rotation of the wheel.

4. The transporter as claimed in claim 1, wherein at least one of the wheels is connected to a translatable guide rod, and a recess receiving the guide rod is arranged in the frame.

5. The transporter as claimed in claim 4, wherein the guide rod is so long that, at least when wheels are placed practically against each other, the guide rod projects relative to the frame.

6. The transporter as claimed in claim 1, further including a second transporter having two rotatable wheels, wherein at least one of the wheels of the transporter is coupled for fixed rotation to at least one of the two rotatable wheels of the second transporter.

7. The transporter as claimed in claim 6, wherein the at least one of the wheels of the transporter coupled to the at least one of the wheels of the second transporter is provided with at least one projecting coupling shaft, and the at least one of the wheels of the second transporter is provided with a recess for receiving the coupling shaft.

8. The transporter as claimed in claim 6, wherein at least one of the transporter or the second transporter is provided with mounting means for releasable mounting of the at least one of the transporter or the second transporter on a support element such that the at least one of the transporter or the second transporter is translatable in a direction parallel to a rotation axis of one of the wheels of the transporter or of the second transporter.

* * * * *

UNITED STATES PATENT AND TRADEMARK OFFICE
CERTIFICATE OF CORRECTION

PATENT NO.   : 6,435,394 B1
DATED        : August 20, 2002
INVENTOR(S)  : Johannes Gerhardus Augustinus Zweers It is certified that error appears in the above-identified patent and that said Letters Patent is hereby corrected as shown below:

Column 3,
Line 66, "other arrying" should read -- other carrying --.

Signed and Sealed this

Fourth Day of February, 2003

JAMES E. ROGAN
*Director of the United States Patent and Trademark Office*